United States Patent
Xu et al.

(10) Patent No.: US 11,777,645 B2
(45) Date of Patent: Oct. 3, 2023

(54) RETRANSMISSION OF PHYSICAL UPLINK CONTROL CHANNEL (PUCCH) FOR ULTRA RELIABLE LOW LATENCY COMMUNICATIONS (URLLC)

(71) Applicant: QUALCOMM Incorporated, San Diego, CA (US)

(72) Inventors: Changlong Xu, Beijing (CN); Liangming Wu, Beijing (CN); Kai Chen, Shenzhen (CN); Jian Li, Beijing (CN); Hao Xu, Beijing (CN); Tingfang Ji, San Diego, CA (US); Joseph Binamira Soriaga, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 61 days.

(21) Appl. No.: 16/967,106

(22) PCT Filed: Feb. 7, 2019

(86) PCT No.: PCT/CN2019/074730
§ 371 (c)(1),
(2) Date: Aug. 3, 2020

(87) PCT Pub. No.: WO2019/154401
PCT Pub. Date: Aug. 15, 2019

(65) Prior Publication Data
US 2020/0366411 A1  Nov. 19, 2020

(30) Foreign Application Priority Data
Feb. 11, 2018  (WO) ............... PCT/CN2018/076296

(51) Int. Cl.
  *H04L 1/00*  (2006.01)
  *H04L 1/08*  (2006.01)
  *H04L 1/1812*  (2023.01)

(52) U.S. Cl.
  CPC .......... *H04L 1/0057* (2013.01); *H04L 1/0026* (2013.01); *H04L 1/0041* (2013.01);
  (Continued)

(58) Field of Classification Search
  None
  See application file for complete search history.

(56) References Cited

U.S. PATENT DOCUMENTS 8,625,509 B2 *  1/2014  Ahn ..................... H04L 1/1861
                                                           375/267
9,722,651 B2    8/2017  Goela et al.
(Continued)

FOREIGN PATENT DOCUMENTS

EP        3264651 A1     1/2018
JP     2012520017 A5 * 12/2012
(Continued)

OTHER PUBLICATIONS

3GPP TS 38.212: "3rd Generation Partnership Project, Technical Specification Group Radio Access Network, NR, Multiplexing and Channel Coding (Release 15)", 3GPP Draft, R1-1721342 CM, 3rd Generation Partnership Project (3GPP), Mobile Competence Centre, 650, Route Des Lucioles, F-06921 Sophia-Antipolis Cedex, France, V1.2.1 (Dec. 2017), Dec. 15, 2017 (Dec. 15, 2017), pp. 1-82, XP051370847.
(Continued)

*Primary Examiner* — Noel R Beharry
*Assistant Examiner* — Rodrick Mak
(74) *Attorney, Agent, or Firm* — Patterson+ Sheridan, L.L.P.

(57) ABSTRACT

Techniques are provided for retransmission of Physical Uplink Shared Channel (PUCCH) for Ultra Reliable Low
(Continued)

Latency Communications (URLLC). A User Equipment (UE) transmits at least one code block of a control channel, the at least one code block including Channel State Information (CSI), wherein each code block is polar encoded by assigning bit indices of the code block to bit channels in a particular order of reliabilities of the bit channels. The UE detects a trigger, and in response, retransmits at least a portion of each code block including retransmitted CSI, wherein the portion is polar encoded by assigning bit indices of the retransmitted CSI to the bit channels in the reverse order of reliabilities of the bit channels as compared to the polar encoding of the CSI.

30 Claims, 13 Drawing Sheets

(52) U.S. Cl.
CPC .............. *H04L 1/0072* (2013.01); *H04L 1/08* (2013.01); *H04L 1/1812* (2013.01)

(56) References Cited

U.S. PATENT DOCUMENTS

| | | | |
|---|---|---|---|
| 2012/0057545 | A1 | 3/2012 | Hariharan et al. |
| 2014/0254538 | A1* | 9/2014 | Park .................... H04L 1/1874 370/329 |
| 2016/0182187 | A1 | 6/2016 | Kim et al. |
| 2018/0007683 | A1 | 1/2018 | You et al. |
| 2018/0026755 | A1 | 1/2018 | Meng |
| 2018/0262214 | A1* | 9/2018 | Hui ....................... H04L 1/1819 |
| 2020/0127786 | A1* | 4/2020 | Kwak ............... H04L 27/26025 |
| 2020/0228236 | A1* | 7/2020 | Xi ......................... H04L 1/0072 |
| 2020/0252084 | A1* | 8/2020 | Chen ................... H03M 13/616 |
| 2020/0321986 | A1* | 10/2020 | Hui ....................... H03M 13/13 |

FOREIGN PATENT DOCUMENTS

| | | | |
|---|---|---|---|
| WO | 2009053930 | A2 | 4/2009 |
| WO | 2016112285 | A2 | 7/2016 |
| WO | 2017003047 | A1 | 1/2017 |
| WO | 2017217715 | A1 | 12/2017 |
| WO | WO-2018173002 | A1 * | 9/2018 ............... H04L 5/00 |

OTHER PUBLICATIONS

Ericsson: "On Long PUCCH Repetition and Other Issues", 3GPP TSG RAN WG1 Meeting AH 1801, 3GPP Draft, R1-1800948, 3rd Generation Partnership Project (3GPP), Mobile Competence Centre, 650, Route Des Lucioles, F-06921 Sophia-Antipolis Cedex, France, vol. RAN WG1, No. Vancouver, Canada, Jan. 22, 2018-Jan. 26, 2018, 5 Pages, Jan. 13, 2018 (Jan. 13, 2018), XP051385181.
Supplementary European Search Report—EP19751741—Search Authority—Munich—dated Sep. 22, 2021.
International Search Report and Written Opinion—PCT/CN2018/076296—ISA/EPO—dated Nov. 7, 2018.
International Search Report and Written Opinion—PCT/CN2019/074730—ISA/EPO—dated May 7, 2019.
ZTE, et al., "Joint Coding Scheme for UCI", 3GPP TSG RAN WG1 Meeting 90bis, R1-1718413, Oct. 13, 2017 (Oct. 13, 2017), pp. 1-7.

* cited by examiner

RETRANSMISSION OF PHYSICAL UPLINK CONTROL CHANNEL (PUCCH) FOR ULTRA RELIABLE LOW LATENCY COMMUNICATIONS (URLLC)

CROSS-REFERENCE TO RELATED APPLICATION

This application is a national stage application under 35 U.S.C. 371 of PCT/CN2019/074730, filed Feb. 7, 2019, which claims the benefit and priority to Chinese Application No. PCT/CN2018/076296, filed Feb. 11, 2018, which are hereby assigned to the assignee hereof and hereby expressly incorporated by reference herein as if fully set forth below and for all applicable purposes.

FIELD

The present disclosure relates generally to wireless communication systems, and more particularly, to methods and apparatus for retransmission of Physical Uplink Control Channel (PUCCH) for Ultra Reliable Low Latency Communications (URLLC).

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an eNodeB (eNB). In other examples (e.g., in a next generation or $5^{th}$ generation (5G) network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, eNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a desire for further improvements in NR technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure provide a method for wireless communications by a User Equipment (UE). The method generally includes transmitting at least one code block of a control channel, the at least one code block including Channel State Information (CSI), wherein each code block is polar encoded by assigning bit indices of the code block to bit channels in a particular order of reliabilities of the bit channels; detecting a trigger; and retransmitting, in response to the trigger, at least a portion of each code block including retransmitted CSI, wherein the portion is polar encoded by assigning bit indices of the retransmitted CSI to the bit channels in the reverse order of reliabilities of the bit channels as compared to the polar encoding of the CSI.

Certain aspects of the present disclosure provide a method for wireless communications by a Base Station (BS). The method generally includes receiving a transmission of at least one code block of a control channel, the at least one code block including Channel State Information (CSI), wherein each code block is polar encoded by assigning bit indices of the code block to bit channels in a particular order of reliabilities of the bit channels; receiving a retransmission of at least a portion of each code block including retransmitted CSI, wherein the portion is polar encoded by assigning bit indices of the retransmitted CSI to the bit channels in the reverse order of reliabilities of the bit channels as compared to the polar encoding of the CSI; and decoding the at least one code block based on the transmission and the retransmission.

Certain aspects of the present disclosure provide an apparatus for wireless communications by a User Equipment (UE). The apparatus generally includes means for transmitting at least one code block of a control channel, the at least one code block including Channel State Information (CSI), wherein each code block is polar encoded by assigning bit indices of the code block to bit channels in a particular order of reliabilities of the bit channels; means for detecting a trigger; and means for retransmitting, in response to the trigger, at least a portion of each code block including retransmitted CSI, wherein the portion is polar encoded by assigning bit indices of the retransmitted CSI to the bit channels in the reverse order of reliabilities of the bit channels as compared to the polar encoding of the CSI.

Certain aspects of the present disclosure provide an apparatus for wireless communications by a Base Station (BS). The apparatus generally includes means for receiving a transmission of at least one code block of a control channel, the at least one code block including Channel State Information (CSI), wherein each code block is polar encoded by assigning bit indices of the code block to bit channels in a particular order of reliabilities of the bit channels; means for receiving a retransmission of at least a portion of each code block including retransmitted CSI, wherein the portion is polar encoded by assigning bit indices of the retransmitted CSI to the bit channels in the reverse order of reliabilities of the bit channels as compared to the polar encoding of the CSI; and means for decoding the at least one code block based on the transmission and the retransmission.

Aspects generally include methods, apparatus, systems, computer readable mediums, and processing systems, as substantially described herein with reference to and as illustrated by the accompanying drawings.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
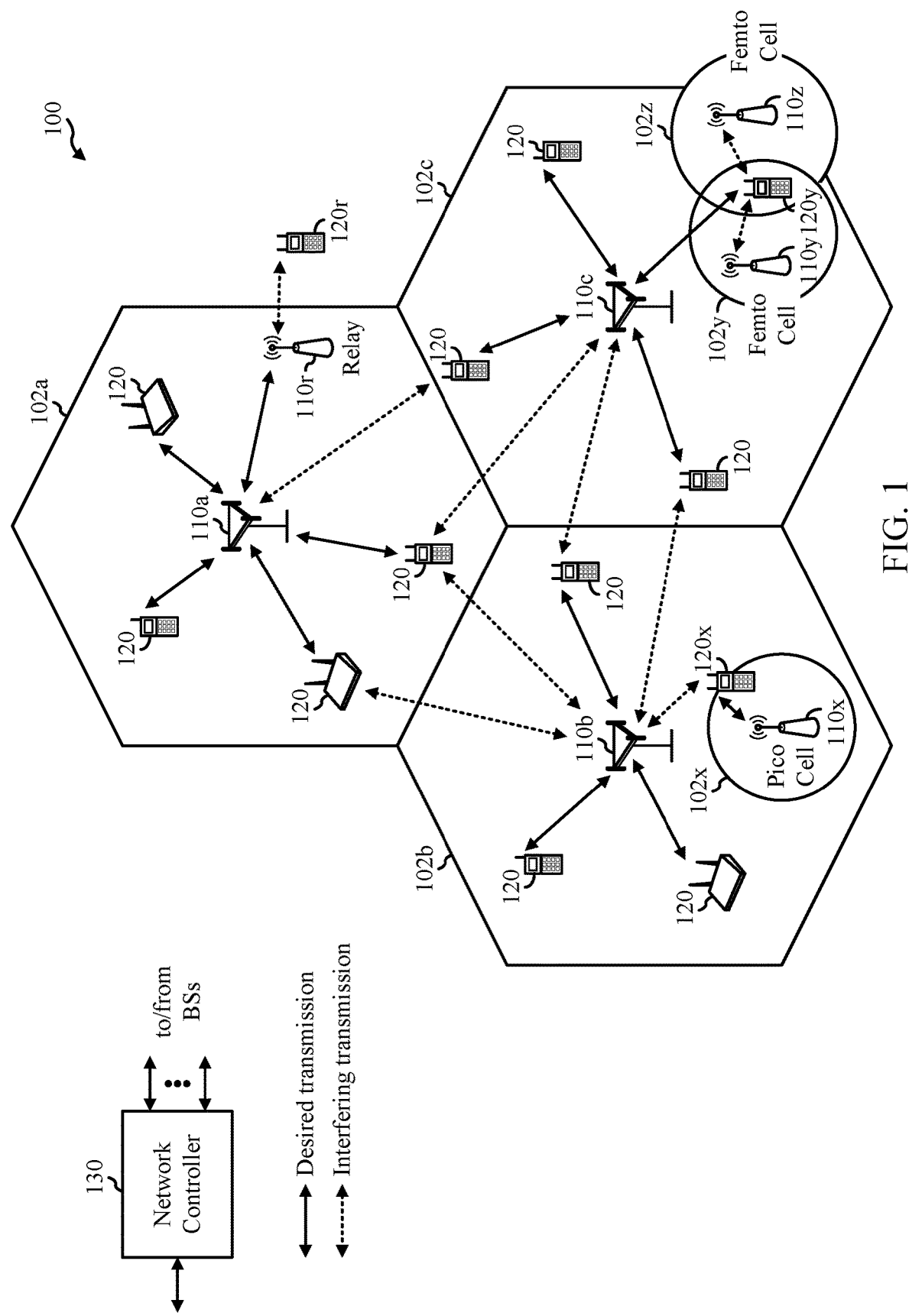
FIG. 1 is a block diagram conceptually illustrating an example telecommunications system, in accordance with certain aspects of the present disclosure.

Ultra-reliable and Low-latency Communications (URLLC) is proposed as a 5G service and is targeted at emerging applications in which data messages are time-sensitive and must be securely delivered end-to-end subject to high reliability and hard latency requirements. The hard latency requirement means that a data transmission that cannot be decoded at the receiver before a deadline is of no use and can be dropped from the system, resulting in the loss of reliability. For example, the general requirements for a URLLC data channel include a Block Error Rate (BLER) of $10^{-5}$ and a latency requirement of 0.5 ms for both uplink and downlink. This is in contrast to the QoS of mobile broadband applications that optimize data throughput and average delay. Use cases of URLLC include autonomous vehicles that perform cooperation and safety functions, monitoring and control in smart grids, tactile feedback in remote medical procedures, control and coordination of unmanned aviation vehicles, robotics, and industrial automation.

It has been discussed that the requirements (e.g., BLER and latency requirements) for the URLLC control channel should be even lower than that for the URLLC data channel. However, the performance and latency of the PUCCH being defined for eMBB in 5G NR is similar to that in LTE. Thus, the eMBB PUCCH definitions may not meet the control channel requirements for URLLC.

Thus, enhancements are necessary to the current PUCCH definitions to meet URLLC control channel requirements. Certain aspects of the present disclosure discuss techniques for retransmission of PUCCH in an attempt to meet control channel requirements for the URLLC including the BLER and latency requirements.

NR may support various wireless communication services, such as Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC). These services may include latency and reliability requirements. These services may also have different transmission time intervals (TTI) to meet respective quality of service (QoS) requirements. In addition, these services may co-exist in the same subframe.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication networks such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). NR is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

Example Wireless Communications System

FIG. 1 illustrates an example wireless network 100, such as a new radio (NR) or 5G network, in which aspects of the present disclosure may be performed.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may be coupled to a set of BSs and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a healthcare device, a medical device, a wearable device such as a smart watch, smart clothing, smart glasses, virtual reality goggles, a smart wrist band, smart jewelry (e.g., a smart ring, a smart bracelet, etc.), an entertainment device (e.g., a music device, a gaming device, a video device, a satellite radio, etc.), a vehicular component or sensor, a smart meter/sensor, industrial manufacturing equipment, a positioning device (e.g., GPS, Beidou, GLONASS, Galileo, terrestrial-based), or any other suitable device that is configured to communicate via a wireless or wired medium. Some UEs may be considered machine-type communication (MTC) devices or enhanced or evolved MTC (eMTC) devices. MTC may refer to communication involving at least one remote device on at least one end of the communication and may include forms of data communication which involve one or more entities that do not necessarily need human interaction. MTC UEs may include UEs that are capable of MTC communications with MTC servers and/or other MTC devices through Public Land Mobile Networks (PLMN), for example. Some UEs may be considered Internet of Things devices. The Internet of Things (IoT) is a network of physical objects or "things" embedded with, e.g., electronics, software, sensors, and network connectivity, which enable these objects to collect and exchange data. The Internet of Things allows objects to be sensed and controlled remotely across existing network infrastructure, creating opportunities for more direct integration between the physical world and computer-based systems, and resulting in improved efficiency, accuracy and economic benefit. When IoT is augmented with sensors and actuators, the technology becomes an instance of the more general class of cyber-physical systems, which also encompasses technologies such as smart grids, smart homes, intelligent transportation and smart cities. Each "thing" is generally uniquely identifiable through its embedded computing system but is able to interoperate within the existing Internet infrastructure. Narrowband IoT (NB-IoT) is a technology being standardized by the 3GPP standards body. This technology is a narrowband radio technology specially designed for the IoT, hence its name. Special focuses of this standard are on indoor coverage, low cost, long battery life and large number of devices. MTC/eMTC and/or IoT UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth (e.g., system frequency band) into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using time division duplex (TDD). A single component carrier bandwidth of 100 MHz may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., eNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
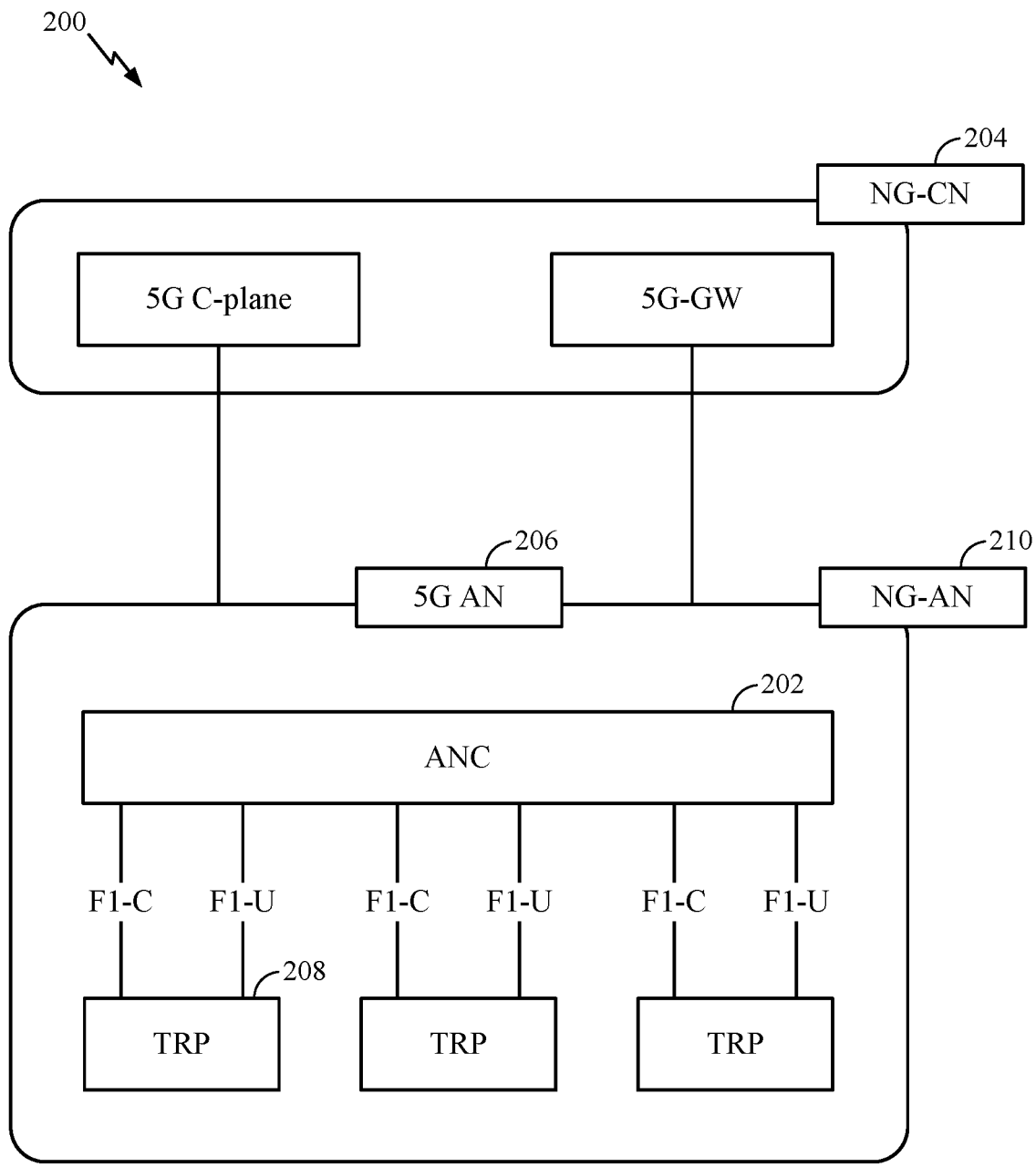
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
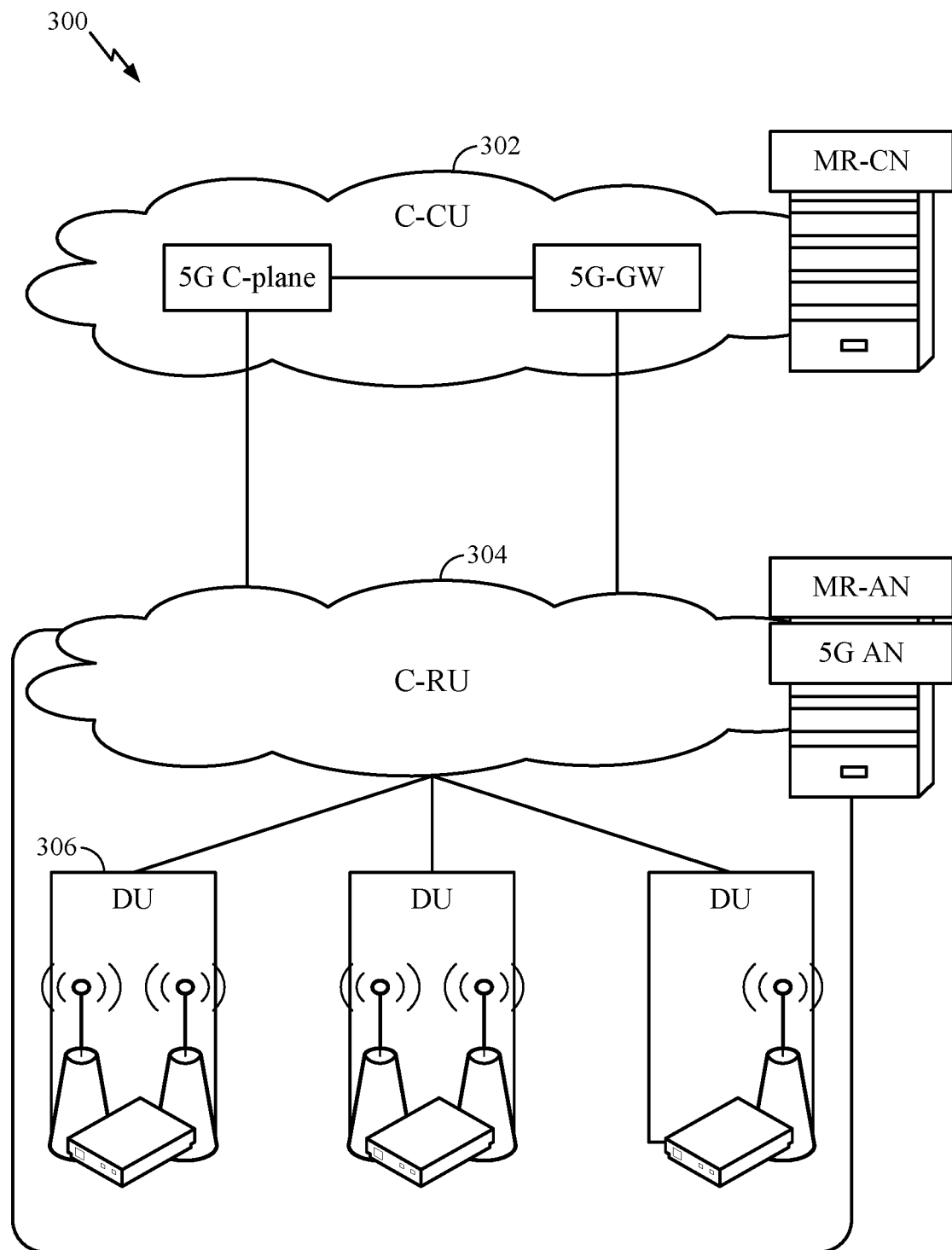
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
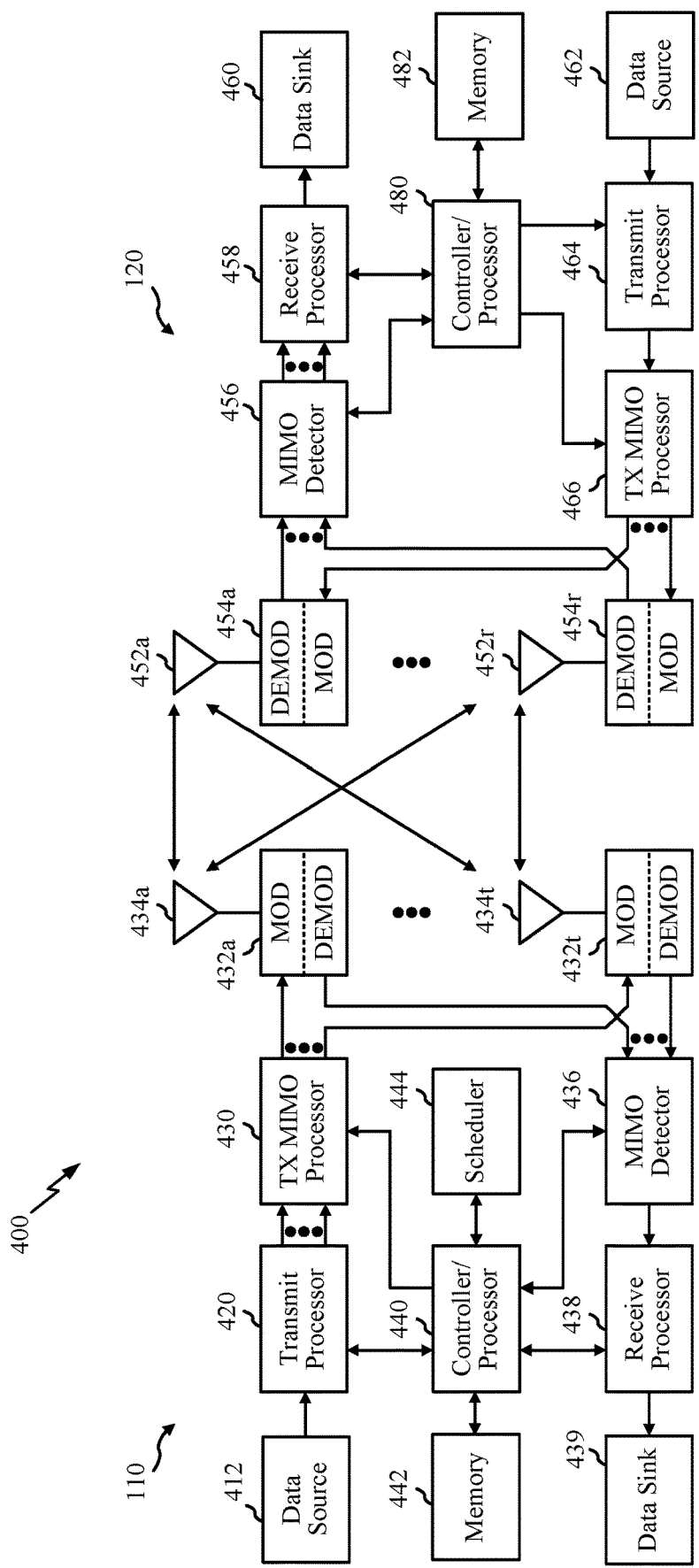
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein and illustrated with reference to FIGS. 9-10.

FIG. 4 shows a block diagram of a design of a BS 110 and a UE 120, which may be one of the BSs and one of the UEs in FIG. 1. For a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. For example, the TX MIMO processor 430 may perform certain aspects described herein for RS multiplexing. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) 454a through 454r, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. For example, MIMO detector 456 may provide detected RS transmitted using techniques described herein. A receive processor 458 may process (e.g., demodulate, deinterleave, and decode) the detected symbols, provide decoded data for the UE 120 to a data sink 460, and provide decoded control information to a controller/processor 480. According to one or more cases, CoMP aspects can include providing the antennas, as well as some Tx/Rx functionalities, such that they reside in distributed units. For example, some Tx/Rx processing can be done in the central unit, while other processing can be done at the distributed units. For example, in accordance with one or more aspects as shown in the diagram, the BS mod/demod 432 may be in the distributed units.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH)) from the controller/processor 480. The transmit processor 464 may also generate reference symbols for a reference signal. The symbols from the transmit processor 464 may be precoded by a TX MIMO processor 466 if applicable, further processed by the demodulators 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the processes for the techniques described herein. The processor 480 and/or other processors and modules at the UE 120 may also perform or direct, e.g., execution of the functional blocks illustrated in FIG. 10, and/or other processes for the techniques described herein. The memories 442 and 482 may store data and program codes for the BS 110 and the UE 120, respectively. A scheduler 444 may schedule UEs for data transmission on the downlink and/or uplink.

Figure 5:
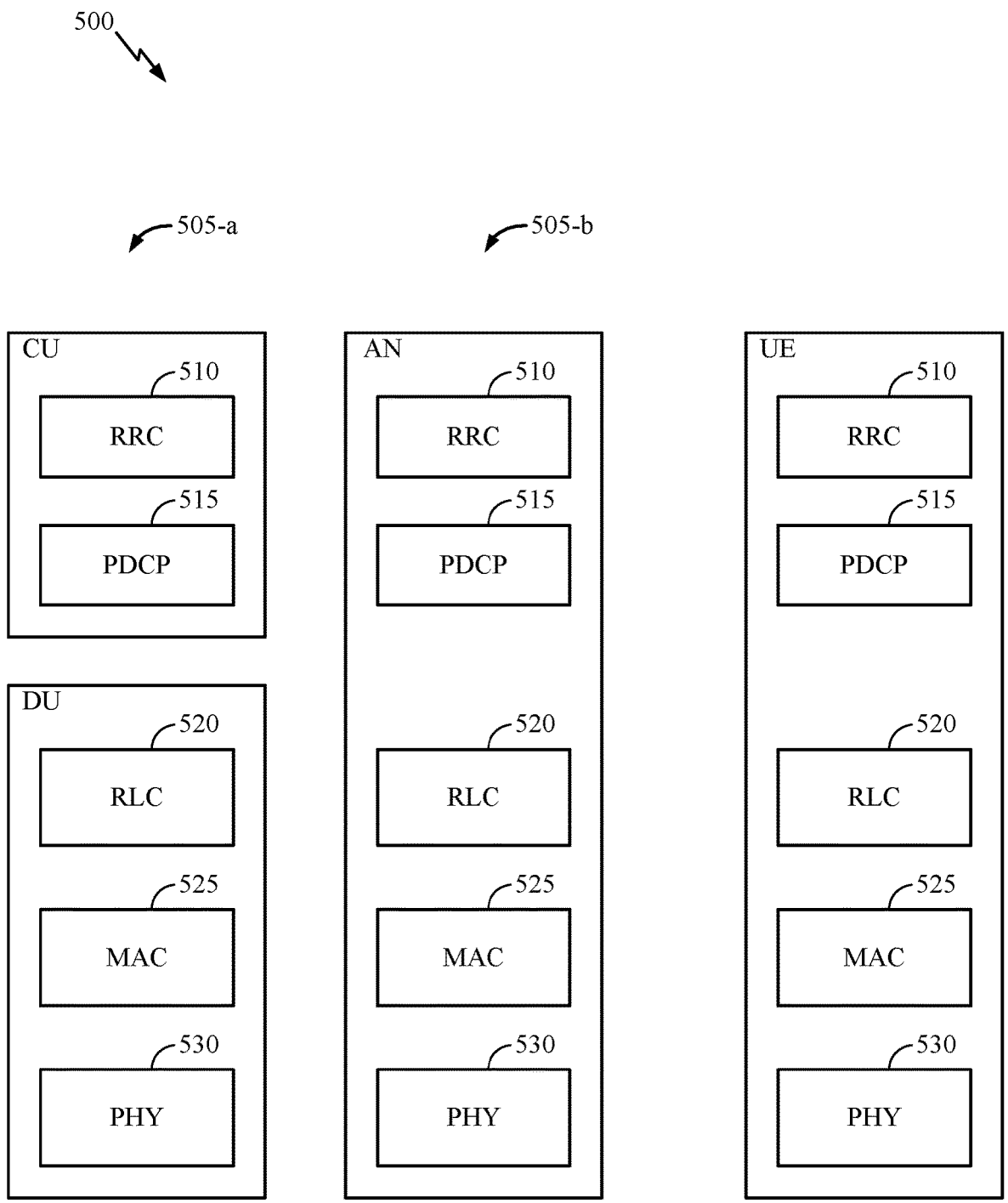
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device (e.g., access node (AN), new radio base station (NR BS), a new radio Node-B (NR NB), a network node (NN), or the like.). In the second option, the RRC layer 510, the PDCP layer 515, the RLC layer 520, the MAC layer 525, and the PHY layer 530 may each be implemented by the AN. The second option 505-b may be useful in a femto cell deployment.

Regardless of whether a network access device implements part or all of a protocol stack, a UE may implement an entire protocol stack (e.g., the RRC layer 510, the PDCP layer 515, the RLC layer 520, the MAC layer 525, and the PHY layer 530).

Figure 6:
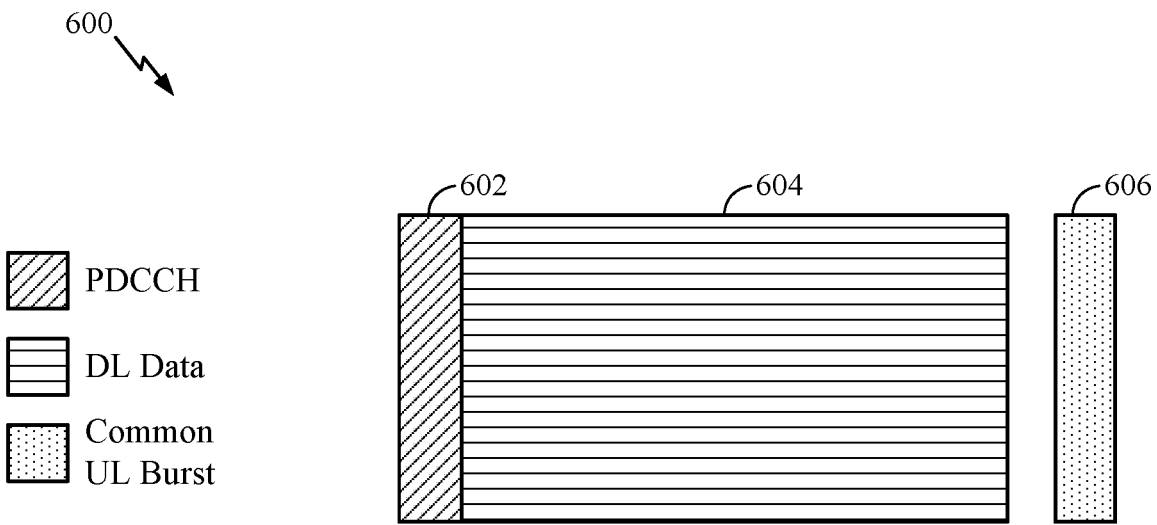
FIG. 6 illustrates an example of a downlink-centric (DL-centric) subframe, in accordance with certain aspects of the present disclosure.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PDSCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information. As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
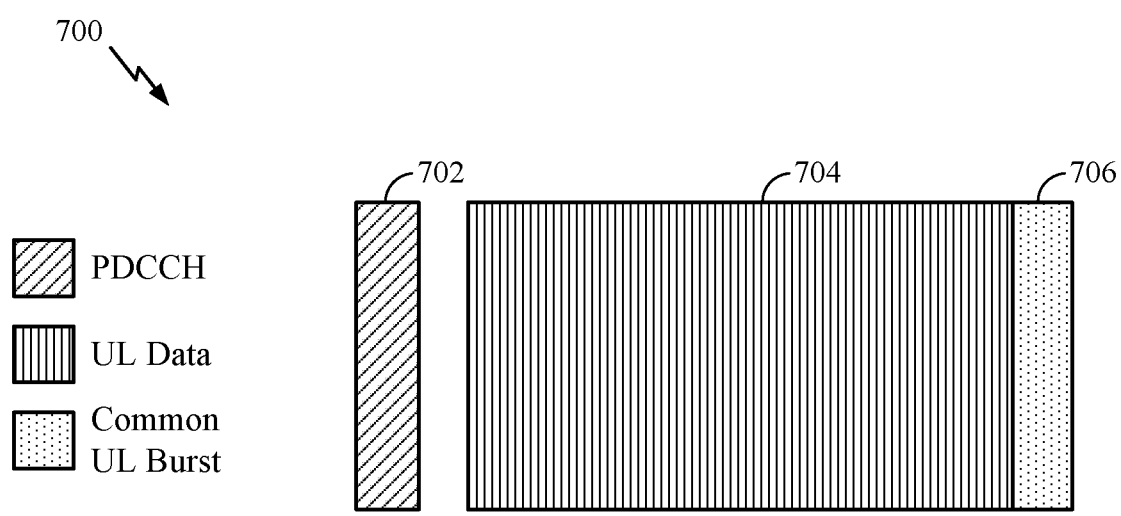
FIG. 7 illustrates an example of an uplink-centric (UL-centric) subframe, in accordance with certain aspects of the present disclosure.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion described above with reference to FIG. 6. The UL-centric subframe may also include an UL data portion 704. The UL data portion 704 may sometimes be referred to as the payload of the UL-centric subframe. The UL data portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additionally or alternatively include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Techniques for Retransmitting PUCCH in URLLC

The International Telecommunication Union (ITU) has classified 5G mobile network services into three categories: Enhanced Mobile Broadband (eMBB), Ultra-reliable and Low-latency Communications (uRLLC), and Massive Machine Type Communications (mMTC). eMBB aims to meet the people's demand for an increasingly digital lifestyle, and focuses on services that have high requirements for bandwidth, such as high definition (HD) videos, virtual reality (VR), and augmented reality (AR). uRLLC aims to meet expectations for the demanding digital industry and focuses on latency-sensitive services, such as assisted and automated driving, and remote management. mMTC aims to meet demands for a further developed digital society and focuses on services that include high requirements for connection density, such as smart city and smart agriculture.

URLLC in particular is targeted at emerging applications in which data messages are time-sensitive and must be securely delivered end-to-end subject to high reliability and hard latency requirements. The hard latency requirement means that a data transmission that cannot be decoded at the receiver before a deadline is of no use and can be dropped from the system, resulting in the loss of reliability. For example, the general requirements for a URLLC data channel include a Block Error Rate (BLER) of $10^{-5}$ and a latency requirement of 0.5 ms for both uplink and downlink. This is in contrast to the QoS (Quality of Service) of mobile broadband applications that optimize data throughput and average delay. Use cases of URLLC include autonomous vehicles that perform cooperation and safety functions, monitoring and control in smart grids, tactile feedback in remote medical procedures, control and coordination of unmanned aviation vehicles, robotics, and industrial automation.

It has been discussed that the requirements (e.g., BLER and latency requirements) for the URLLC control channel should be even lower than that for the URLLC data channel. However, the performance and latency of the PUCCH being defined for eMBB in 5G NR is similar to that in LTE. Thus, the eMBB PUCCH definitions may not meet the control channel requirements for URLLC.

Thus, enhancements are necessary to the current PUCCH definitions to meet URLLC control channel requirements.

Figure 8:
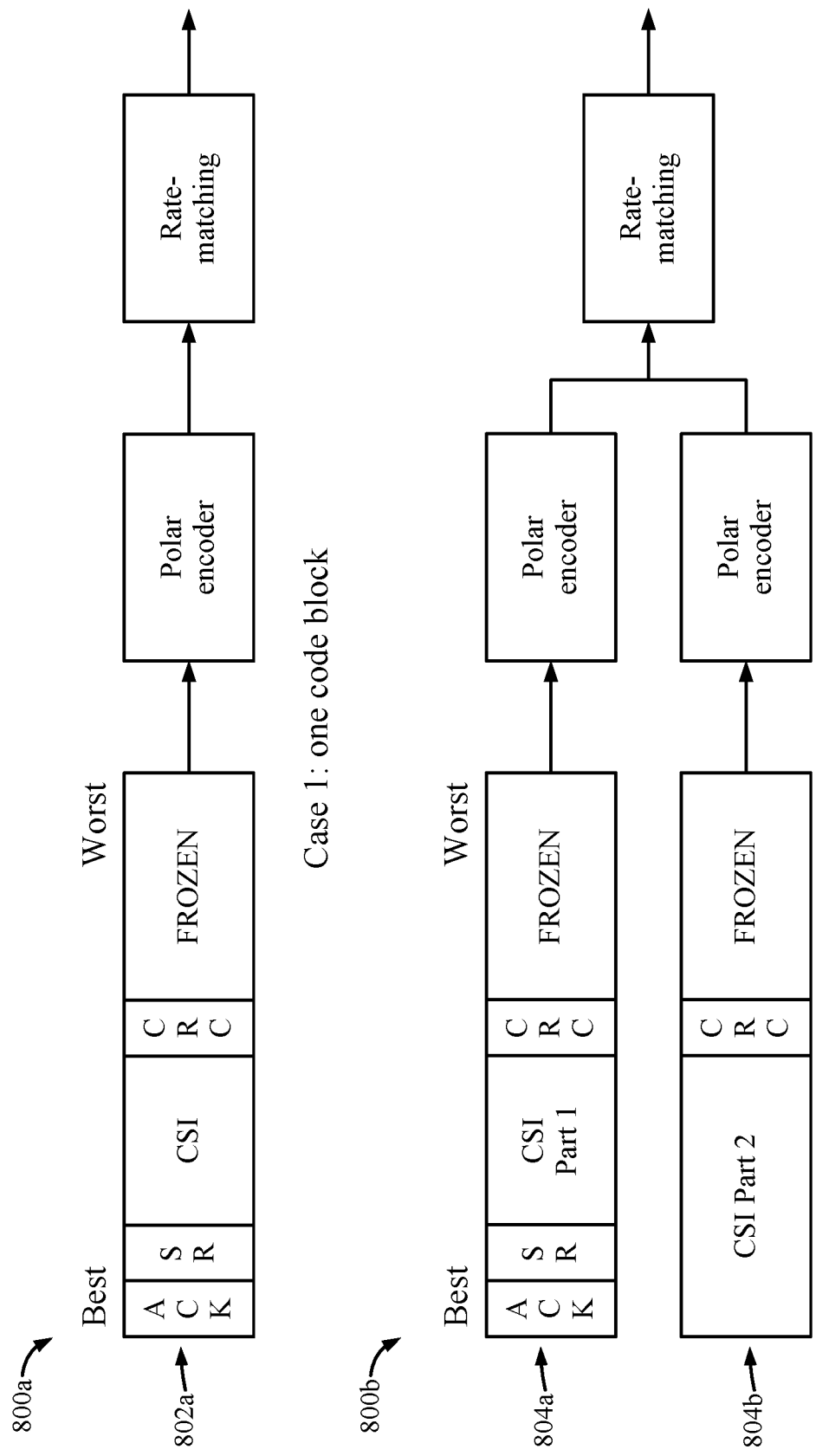
FIG. 8 illustrates current PUCCH solutions 900a and 900b, in accordance with certain aspects of the present disclosure.

FIG. 8 illustrates current PUCCH solutions 800a and 800b, in accordance with certain aspects of the present disclosure.

800a illustrates a single code block case for transmitting PUCCH and 800b illustrates two code block case for transmitting PUCCH. As shown, the code block 802 includes bits corresponding to acknowledgement (e.g., for a downlink data channel), Scheduling Request (SR), Chanel State Information (CSI), Cyclic Redundancy Check (CRC) and frozen bits.

The acknowledgement bits include bits for acknowledging transmissions received on a data channel (e.g., PDCCH). For example, the acknowledgement bits may include ACK bit(s) for indicating that a transmission or part thereof was successfully received by a UE or NACK bit(s) for indicating that a transmission or part thereof was not received successfully by the UE.

The CSI bits include bits for indicating channel state of a communications link or channel (e.g., downlink channel) to the network (e.g., gNB). For example, the UE may use the CSI to report quality (e.g., SNR) of a downlink channel to the base station to aid the base station to adjust downlink transmissions based on the quality of the downlink channel. The UE generally estimates the CSI based on transmissions (e.g., training signals) received from the base station.

The SR is a special physical layer message for UE to ask the network to send UL grant (e.g., via Downlink Control Information, DCI) so that the UE may transmit PUSCH. The SR bits include bits for a scheduling request.

In an aspect, the frozen bits as shown in FIG. 8 are associated with polar coding. In certain aspects, according to current 5G specifications the PUCCH may be encoded using polar encoding. A Polar code is constructed by recursively applying a linear polarization transform to the binary input symmetric and memoryless channel W, expressed as the 2-by-2 matrix. Repeated use of the transform, $n = \log_2(N)$ times, results in an N-by-N matrix, denoting the n-fold Kronecker product. Polar codes leverage a phenomenon known as channel polarization. Above transform together with a successive cancellation decoder structure turns the N available channels (N channel uses) in to another set of N bit-channels, referred to as synthesized channels, such that the capacities of these bit channels tend to be 0 (fully unreliable) or to 1 (fully reliable) when N goes to infinity.

In fact, the proportion of reliable channels, K, tends to be the capacity of the original communication channel Data is communicated by placing information bits on the K reliable channels and placing fixed bits, usually zeros, on the N−K unreliable channels. These bits on the unreliable channels are referred to as frozen bits, and the set of their positions is referred to as the frozen set F of size N−K. Frozen bits and the frozen set is known by both the encoder and the decoder. In this way, a polar code of code length N, information word length K, and code rate R=K/N is constructed.

As shown, the PUCCH code block 802 is polar coded and rate matched. In an aspect, for polar encoding the code block 802, information bits of the code block 802 are assigned to reliable bit channels in a particular order of reliabilities. For example, as shown, the information bits of the code block 802 are assigned to the bit channels in decreasing order of reliabilities of the bit channels. As shown, the information bits of the code block 802 are assigned to the bit channels in the order ACK bits, SR bits, CSI bits, and CRC bits, with the ACK bits assigned the best or most reliable bit channels and the CRC bits assigned the least reliable bit channels of the bit channels assigned to the information bits. As noted above, the frozen bits may be assigned the worst or unreliable bit channels. In an aspect, the ACK bits, SR bits, CSI bits, and CRC bits may be assigned the bit channels in any other order. In an aspect, the code block need not have each of the ACK bits, SR bits, CSI bits, and CRC bits and may have one or more of these for a given code block.

In certain aspects, for larger amounts of CSI data (e.g., in MIMO case), the CSI bits may be divided into two parts and each part may be transmitted in a separate code block. As shown in 800b, code block 804a carries a first part (Part 1) of the CSI bits and another code block 804b carries a second part (Part 2) of the CSI bits. Code block 804a, like code block 802, includes information bits including ACK bits, SR bits, CSI bits for CSI Part 1, and CRC bits, and frozen bits. However, as noted above regarding code block 802, code block 804a may have any combination of the ACK bits, SR bits, CSI bits, and CRC bits. Code block 804b includes CSI bits for CSI Part 2 and CRC bits, and frozen bits.

In an aspect, as shown, each of the code blocks 804a and 804b is separately polar encoded. Like code block 802, the information bits of each of the code blocks 804a and 804b are assigned to the bit channels in decreasing order of reliabilities of the bit channels. For example, the information bits of the code block 804a are assigned to the bit channels in the order ACK bits, SR bits, CSI bits, and CRC bits, with the ACK bits assigned the best or most reliable bit channels and the CRC bits assigned the least reliable bit channels of the bit channels assigned to the information bits. Similarly, the information bits of the code block 804b are assigned to the bit channels in the order CSI bits and CRC bits, with the CSI bits assigned the best or most reliable bit channels and the CRC bits assigned the least reliable bit channels of the bit channels assigned to the information bits. As noted above, the frozen bits of both code blocks 804a and 804b may be assigned the worst or unreliable bit channels.

Certain aspects of the present disclosure discuss techniques for retransmission of PUCCH code blocks in an attempt to meet control channel requirements for the URLLC including BLER and latency requirements.

Figure 9:
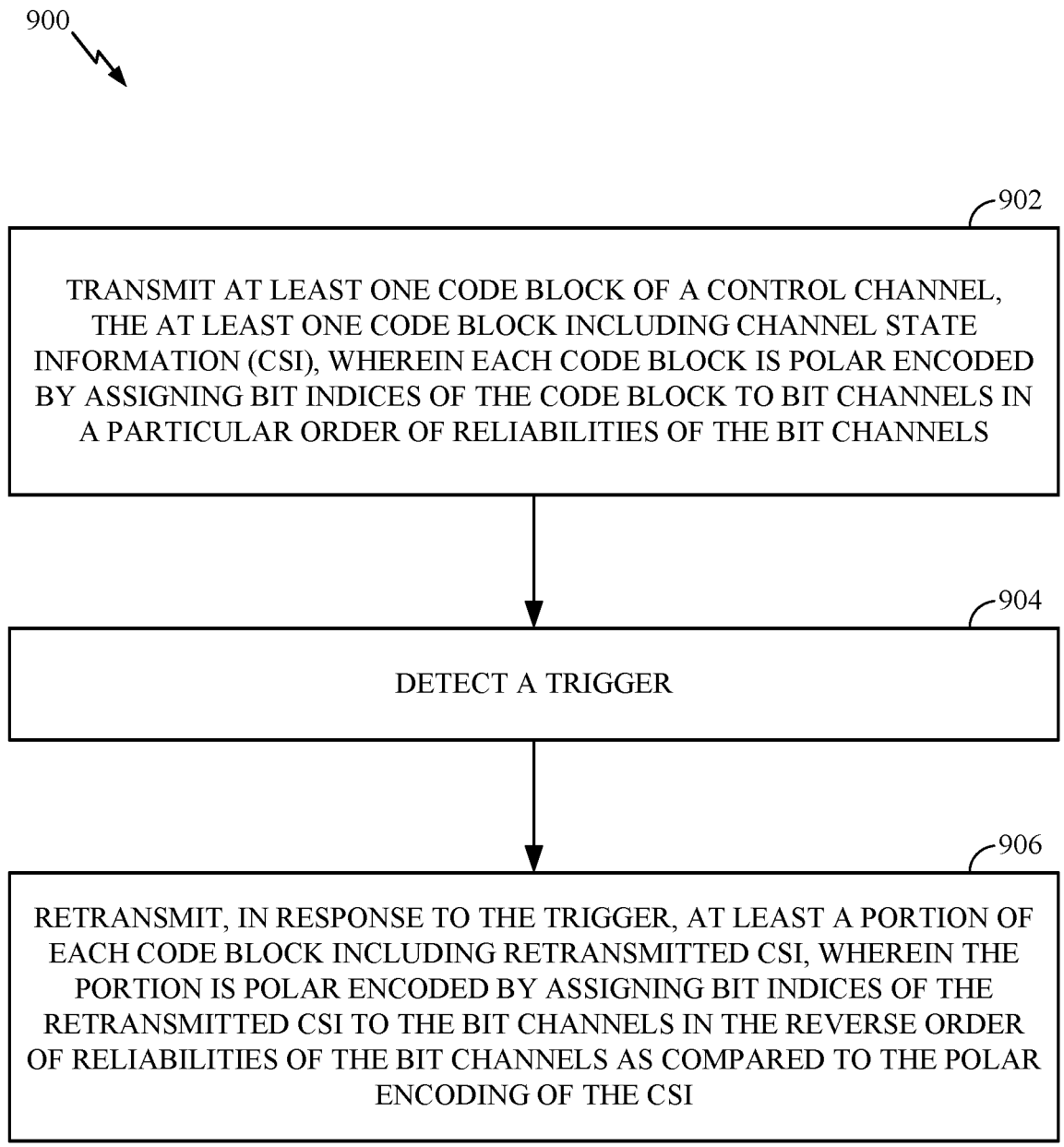
FIG. 9 illustrates example operations 1000 performed by a User Equipment (UE) for retransmitting PUCCH bits, in accordance with certain aspects of the present disclosure.

FIG. 9 illustrates example operations 900 performed by a User Equipment (UE) for retransmitting PUCCH bits, in accordance with certain aspects of the present disclosure.

Operations 900 begin, at 902, by transmitting at least one code block of a control channel (e.g., PUCCH), the at least one code block including CSI, wherein each code block is polar encoded by assigning bit indices of the code block to bit channels in a particular order of reliabilities of the bit channels. At 904, the UE detects a trigger. At 906, the UE retransmits, in response to the trigger, at least a portion of each code block including retransmitted CSI, wherein the portion is polar encoded by assigning bit indices of the retransmitted CSI to the bit channels in the reverse order of reliabilities of the bit channels as compared to the polar encoding of the CSI.

Figure 10:
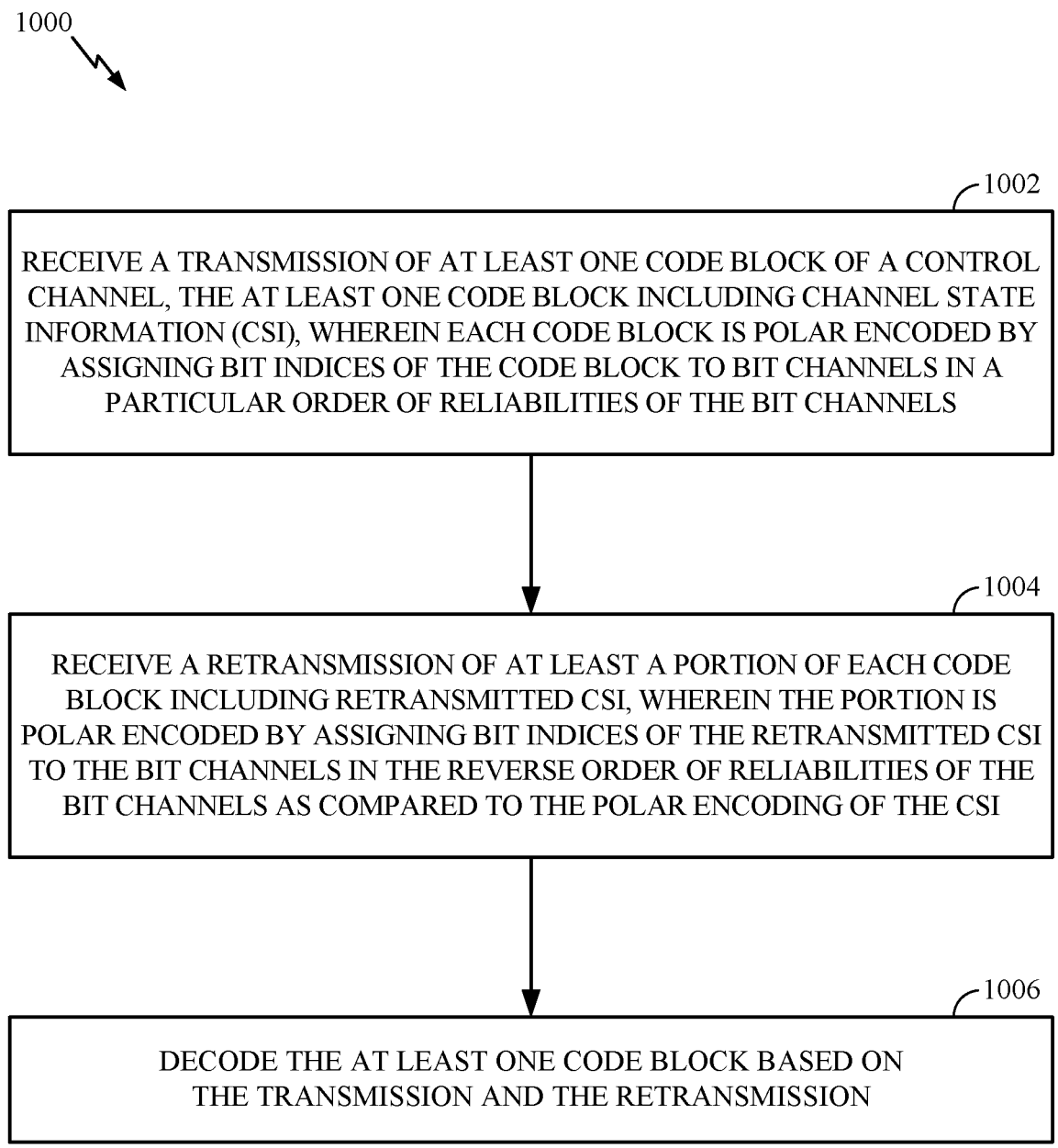
FIG. 10, illustrates example operations 1100 performed by a Base Station, BS (e.g., gNB) for retransmission of PUCCH bits (e.g., by a UE), in accordance with certain aspects of the present disclosure.

FIG. 10, illustrates example operations 1000 performed by a Base Station, BS (e.g., gNB) for retransmission of PUCCH bits (e.g., by a UE), in accordance with certain aspects of the present disclosure.

Operations 1000 begin, at 1002, by receiving a transmission of at least one code block of a control channel, the at least one code block including Channel State Information (CSI), wherein each code block is polar encoded by assigning bit indices of the code block to bit channels in a particular order of reliabilities of the bit channels. At 1004, the BS receives a retransmission of at least a portion of each code block including retransmitted CSI, wherein the portion is polar encoded by assigning bit indices of the retransmitted CSI to the bit channels in the reverse order of reliabilities of the bit channels as compared to the polar encoding of the CSI. At 1006, the BS decodes the at least one code block based on the transmission and the retransmission.

In an aspect, for each code block, for transmitting (e.g., first transmission) of the CSI, the bit indices of the code block are assigned to the bit channels in decreasing order of reliabilities of the bit channels, wherein the CSI is assigned the bit channels starting from the lowest CSI bit index to the highest CSI bit index. In an aspect, for each code block, for retransmitting the CSI (e.g., a second transmission), the bit indices of the portion are assigned to the bit channels in decreasing order of reliabilities of the bit channels, and wherein the retransmitted CSI is assigned bit channels starting from the highest CSI bit index to the lowest CSI bit index.

Figure 11:
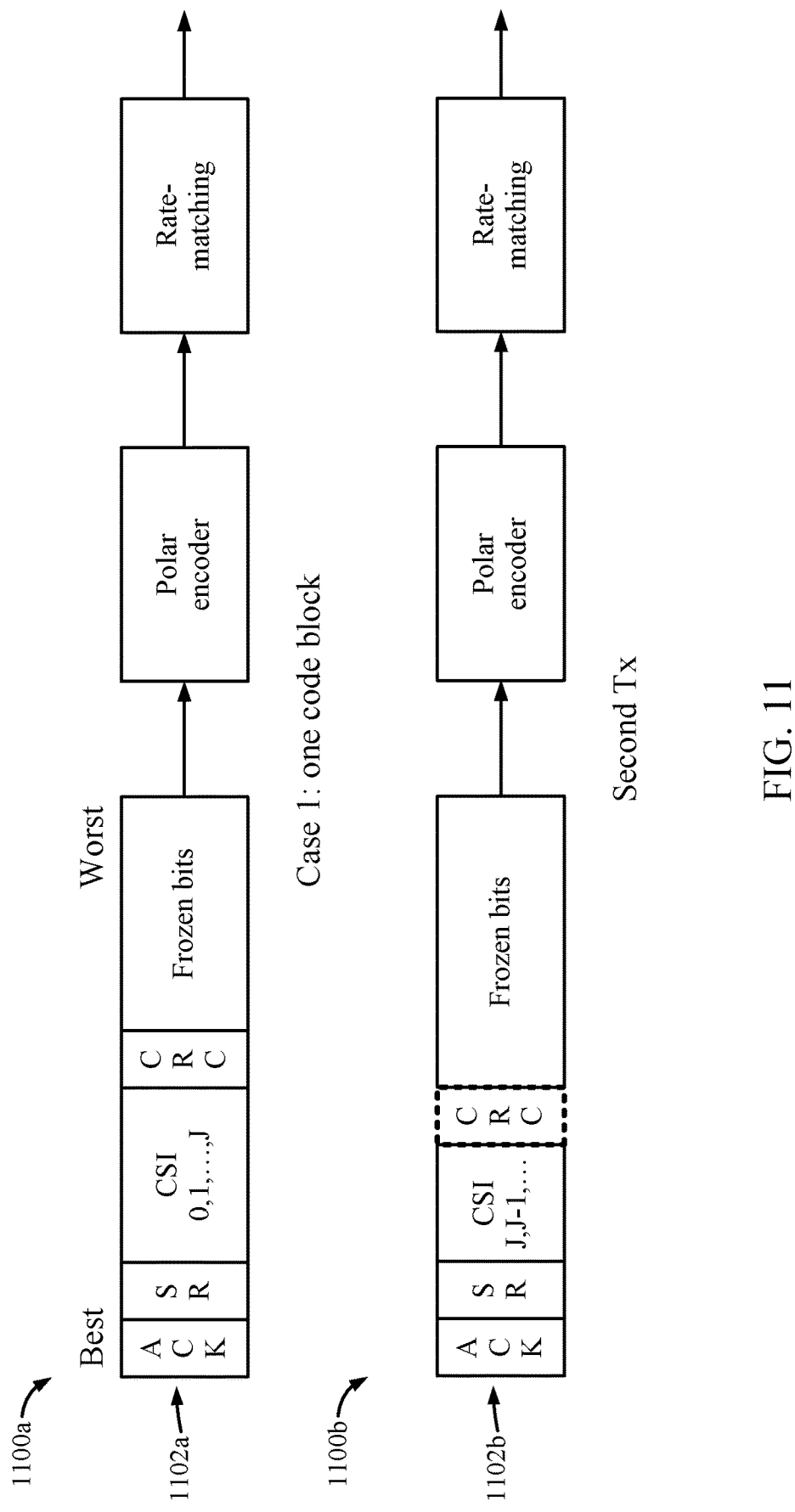
FIG. 11 illustrates retransmission of a single PUCCH code block, in accordance with certain aspects of the present disclosure.

FIG. 11 illustrates retransmission of a single PUCCH code block, in accordance with certain aspects of the present disclosure. 1100a shows a first or initial transmission of a PUCCH code block 1102a and 1100b shows a second transmission or a retransmission of the code block 1102a as a retransmitted code block 1102b.

The first transmission of the code block 1102a is carried out similar to the transmission of code block 802 shown in FIG. 8. Like code block 802 of FIG. 8, the code block 1102a includes bits corresponding to acknowledgement (ACK bits including ACK/NACK bits), SR bits, CSI bits, CRC bits and frozen bits.

For the first transmission, the PUCCH code block 1102a is polar coded and rate matched. In an aspect, for polar encoding the code block 1102a, information bits of the code block 1102a are assigned to reliable bit channels in a particular order of reliabilities. For example, as shown, the information bits of the code block 1102a are assigned to the bit channels in decreasing order of reliabilities of the bit channels. As shown, the information bits of the code block 1102 are assigned to the bit channels in the order ACK bits, SR bits, CSI bits, and CRC bits, with the ACK bits assigned the best or most reliable bit channels and the CRC bits assigned the least reliable bit channels of the bit channels assigned to the information bits. The CSI bits include CSI bit indices 0, 1, . . . , j. The CSI bits are assigned to the bit channels in the decreasing order of reliabilities of the bit channels starting from lowest CSI index 0 to the highest CSI bit index j.

As noted above, the frozen bits may be assigned the worst or unreliable bit channels. As noted previously with regard to code block 802, the ACK bits, SR bits, CSI bits, and CRC bits may be assigned the bit channels in any other order and any other combination of one or more of the ACK bits, SR bits, CSI bits, and CRC bits.

As shown in 1100b, the retransmitted code block 1102b includes the contents of the code block 1102a including the ACK bits, SR bits, CSI bits, CRC bits and frozen bits. In an aspect, a UE may not retransmit the entire contents of the code block 1102a and may retransmit only a portion of the code block 1102a, for example, based on feedback from a base station. In an aspect, the UE may receive feedback from the base station including decoding results (e.g., ACK/NACK) for the first transmission of code block 1102a. The UE, based on the feedback, may retransmit only those bits which were not successfully decoded by the base station. For example, as shown in 1100b, the retransmitted code block 1102b includes only a portion of the CSI bits (CSI bit indices j, j−1, j−2, . . . , L, where j>=L>=0) transmitted as part of the first transmission of code block 1102a.

In an aspect, CRC may not be necessary for the second transmission and the UE may not include CRC in the retransmitted code block 1102b. In certain aspects, among other things, the size of the retransmitted code block may depend on amount of resources allocated for the retransmission, type of CSI, ACK/NACK feedback of a first transmission, and the like.

In an aspect, for polar encoding the retransmission, the CSI bit indices are assigned to the bit channels in the reverse order of reliabilities of the bit channels as compared to the polar encoding for the first transmission. For example, while the information bit sequence of the code block 1102b, like code block 1102a, are assigned to the bit channels in the decreasing order of reliabilities of the bit channels, the CSI bit sequence is assigned to the bit channels starting from the highest CSI bit index j to the lowest CSI bit index L. Thus, amongst the CSI bits, the highest CSI bit index j is assigned to the most reliable bit channel and the lowest CSI bit index L is assigned to the least reliable bit channel.

In an aspect, the UE may retransmit the entire code block 1102a even if the BS was able to decode a portion of the code block 1102a. For example, the UE may retransmit the entire code bock 1102a if it receives an indication that the BS was unable to decode a portion of the code block 1102a.

Figure 12:
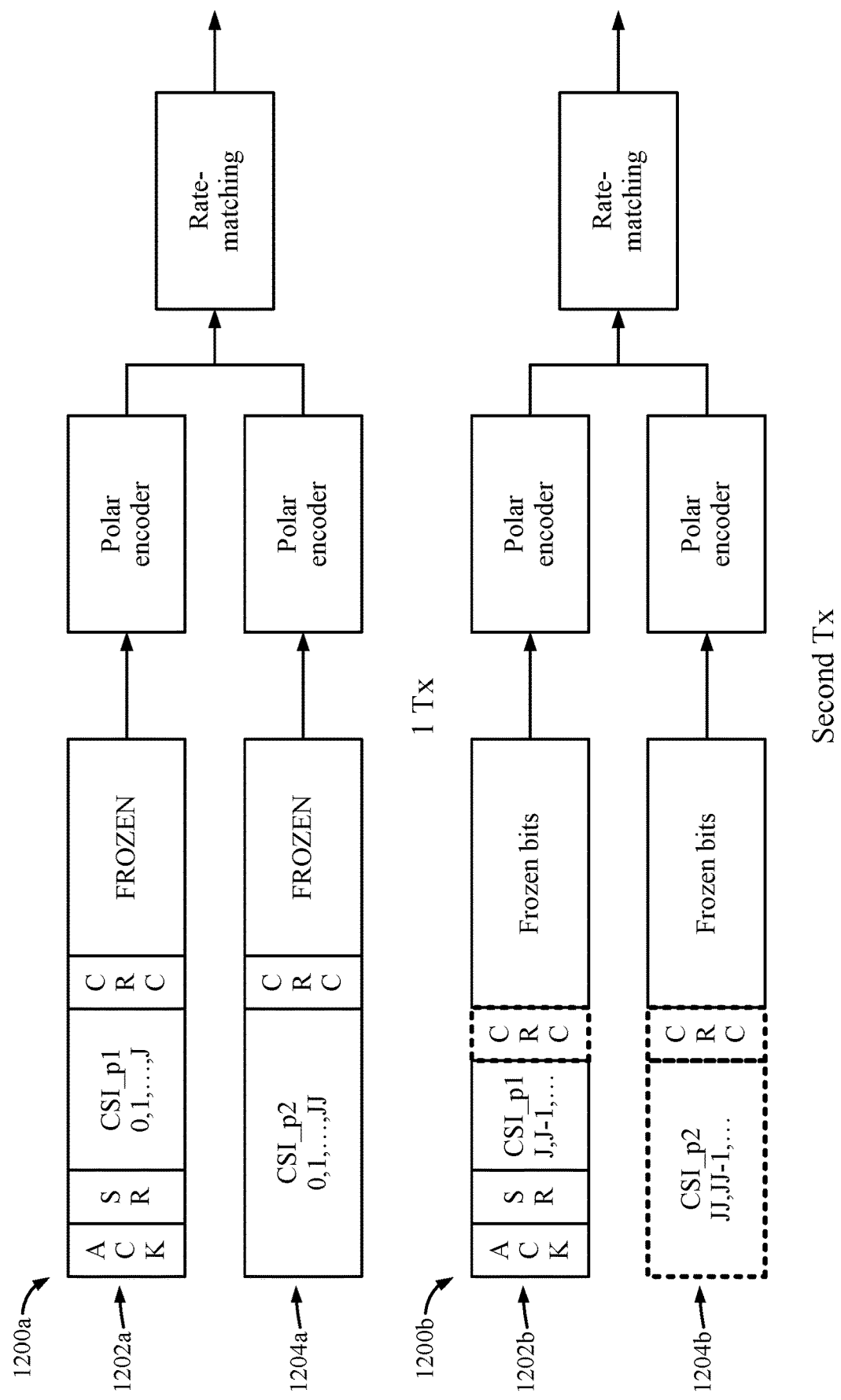
FIG. 12 illustrates retransmission of two PUCCH code blocks, in accordance with certain aspects of the present disclosure.

FIG. 12 illustrates retransmission of two PUCCH code blocks, in accordance with certain aspects of the present disclosure. As discussed previously with reference to FIG. 8, for larger amounts of CSI data, the CSI bits may be divided into two parts and each part may be transmitted in a separate code block. 1200a shows a first or initial transmission of PUCCH code blocks 1202a and 1204a. 1200b shows a second transmissions or retransmissions of the code blocks 1202a and 1204a as retransmitted code blocks 1202b and 1204b.

As shown in 1200a, code block 1202a carries a first part (Part 1) of the CSI bits and code block 1204a carries a second part (Part 2) of the CSI bits.

The first transmission of the code blocks 1202a and 1204a are carried out similar to the transmission of code blocks 804a and 804b shown in FIG. 8. Code block 1202a includes information bits including ACK bits, SR bits, CSI bits for CSI Part 1 (CSI_p1), and CRC bits, and frozen bits. Code block 1204a includes CSI bits for CSI Part 2 (CSI_p2) and CRC bits, and frozen bits.

For the first transmission, each of the PUCCH code blocks 1202a and 1204a is polar coded separately. In an aspect, the information bits of each of the code blocks 1202a and 1204a are assigned to reliable bit channels in decreasing order of reliabilities of the bit channels. As shown, the information bits of the code block 1202a are assigned to the bit channels in the order ACK bits, SR bits, CSI bits, and CRC bits, with the ACK bits assigned the best or most reliable bit channels and the CRC bits assigned the least reliable bit channels of the bit channels assigned to the information bits. The CSI bits of code block 1202a include CSI bit indices 0, 1, . . . , j. The CSI bits are assigned to the bit channels in the decreasing order of reliabilities of the bit channels starting from lowest CSI index 0 to the highest CSI bit index j.

Similarly, the information bits of the code block 1204a are assigned to the bit channels in the order CSI bits and CRC bits, with the CSI bits assigned the best or most reliable bit channels and the CRC bits assigned the least reliable bit channels of the bit channels assigned to the information bits. The CSI bits of code block 1204*a* include CSI bit indices 0, 1, . . . , j. The CSI bits are assigned to the bit channels in the decreasing order of reliabilities of the bit channels starting from lowest CSI index 0 to the highest CSI bit index jj. As noted above, the frozen bits may be assigned the worst or unreliable bit channels.

As shown in 1200*b*, the retransmitted code blocks 1202*b* and 1204*b* include the contents of the code blocks 1202*a* and 1204*a* respectively, including the ACK bits, SR bits, CSI bits, CRC bits and frozen bits. In an aspect, a UE may not retransmit the entire contents of the code blocks 1202*a* and 1204*a* and may retransmit only portions of the code block 1202*a* and 1204*a*, for example, based on feedback from a base station. For example, as shown in 1200*b*, the retransmitted code block 1202*b* includes only a portion of the CSI bits (CSI bit indices j, j–1, j–2, . . . , L, where L>=0) transmitted as part of the first transmission of code block 1202*a*. Similarly, the retransmitted code block 1204*b* includes only a portion of the CSI bits (CSI bit indices jj, jj–1, jj–2, . . . , LL, where LL>=0) transmitted as part of the first transmission of code block 1204*a*.

In an aspect, CRC may not be necessary for each of the second transmissions and the UE may not include CRC in the retransmitted code blocks 1202*b* and 1204*b*. In certain aspects, among other things, the sizes of the retransmitted code blocks may depend on amount of resources allocated for the retransmission, type of CSI, ACK/NACK feedback of a first transmission, and the like.

In an aspect, for polar encoding each retransmission, the CSI bit indices are assigned to the bit channels in the reverse order of reliabilities of the bit channels as compared to the polar encoding for the first transmission. For example, while the information bit sequence of the code block 1202*b*, like code block 1202*a*, are assigned to the bit channels in the decreasing order of reliabilities of the bit channels, the CSI bit sequence is assigned to the bit channels starting from the highest CSI bit index j to the lowest CSI bit index L. Thus, amongst the CSI bits, the highest CSI bit index j is assigned to the most reliable bit channel and the lowest CSI bit index L is assigned to the least reliable bit channel. Similarly, while the information bit sequence of the code block 1204*b*, like code block 1204*a*, are assigned to the bit channels in the decreasing order of reliabilities of the bit channels, the CSI bit sequence is assigned to the bit channels starting from the highest CSI bit index jj to the lowest CSI bit index LL. That is, amongst the CSI bits, the highest CSI bit index jj is assigned to the most reliable bit channel and the lowest CSI bit index LL is assigned to the least reliable bit channel.

In an aspect, as noted above the UE may retransmit an entire code block (e.g., 1202*a* and/or 1204*a*) even if the BS was able to decode a portion of the code block. For example, the UE may retransmit the entire code bock if it receives an indication that the BS was unable to decode a portion of the code block.

In an aspect, a base station (e.g., gNB) may decode a PUCCH code block based on a first or initial transmission and one or more retransmissions of the code block.

Figure 13:
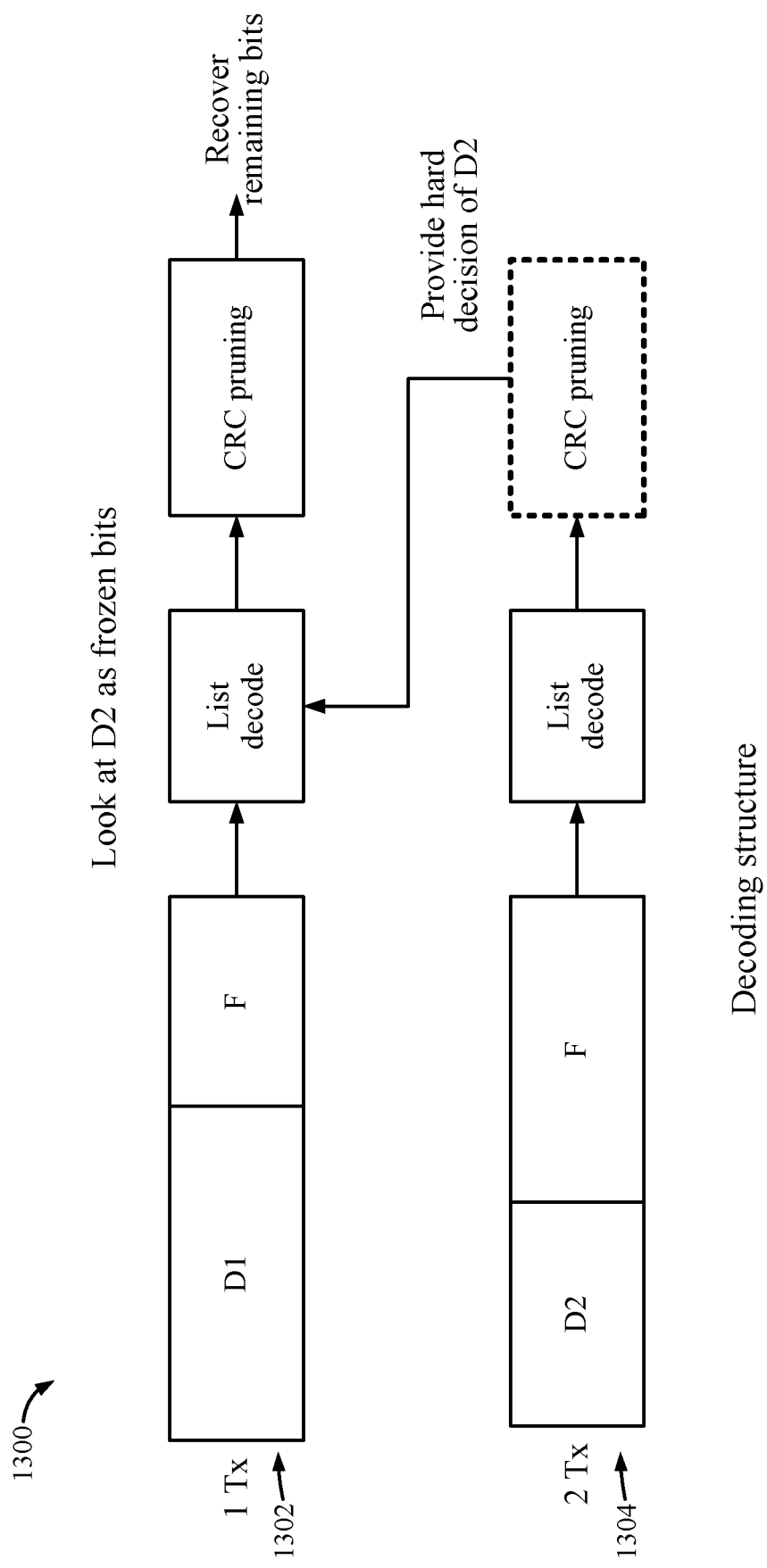
FIG. 13 illustrates an example decoding 1400 of a PUCCH code block by a base station (gNB), in accordance with certain aspects of the present disclosure.

FIG. 13 illustrates an example decoding 1300 of a PUCCH code block by a base station (gNB), in accordance with certain aspects of the present disclosure. Code block 1302 denotes an initial transmission of a code block as decoded at the BS and code block 1304 denotes a retransmission of the code block as decoded by the BS. In an aspect, the BS attempts to decode the retransmitted code block first to generate the decoded code block 1304. D2 denotes the decoded bits from the decoded retransmission.

The BS optionally performs CRC pruning for the decoded code block 1304, for example, only if CRC was included in the retransmission.

As shown, a hard decision from decoding the retransmission is provided for decoding the initial transmission. In an aspect, the hard decision includes the successfully decoded bits D2 from the retransmission. The BS designates the D2 bits successfully decoded from the retransmission as frozen bits (e.g., known bits) and attempts to decode only those bits from the initial transmission which were not decoded from the retransmission. The BS recovers the remaining bits (e.g., bits not included in D2) after CRC pruning. D1 denotes entire decoded contents of the initial transmission and includes the D2 bits decoded from the retransmission and the remaining bits decoded from the initial transmission. In an aspect, this two stage technique for decoding the PUCCH code block may reduce the effective code rate as the number of bits decoded from the first transmission is reduced.

In certain aspects, the UE may retransmit each code block or portion thereof after a first transmission of the code block, without receiving any feedback from the base station. In an aspect, the UE may carry out the retransmission in a preconfigured retransmission opportunity. In an aspect, the trigger for the UE to retransmit at least a portion of a code block is detecting a retransmission opportunity after a first transmission of the code block. In an aspect, the UE may add a retransmission opportunity between two transmission opportunities used for first transmissions of code blocks, and retransmit at least a portion of a code block in a retransmission opportunity after a first transmission of the code block. In an aspect, adding a retransmission opportunity between two first transmission opportunities reduces a current transmission period to half.

Figure 14:
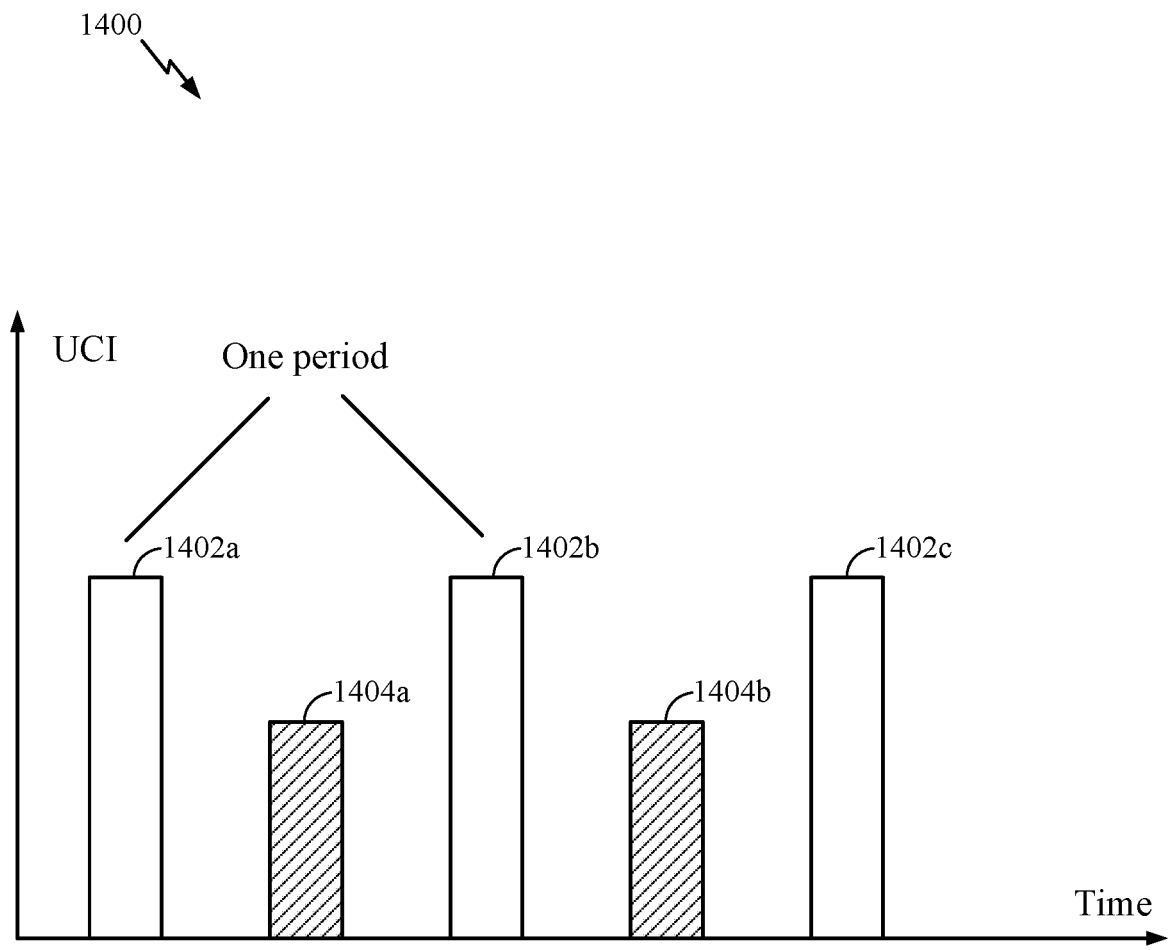
FIG. 14 illustrates retransmission of code blocks in pre-configured retransmission opportunities, in accordance with certain aspects of the present disclosure.

FIG. 14 illustrates retransmission of code blocks in pre-configured retransmission opportunities, in accordance with certain aspects of the present disclosure. As shown, a retransmission opportunity (e.g., 1404*a* and 1404*b*) is configured after each transmission opportunity (e.g., 1402*a*, 1402*b*, and 1402*c*). The time period between two transmission opportunities (e.g., 1402*a*-1402*b* and 1402*b*-1402*c*) may be referred to as one time period. As shown, each of the retransmission opportunities (e.g., 1404*a* and 1404*b*) reduces the transmission period to half. In an aspect, no additional signaling is needed from the network for the retransmission of code blocks or a portion thereof in pre-configured re-transmission opportunities.

In certain aspects, the network (e.g., gNB) may transmit feedback to a UE including decoding results from decoding one or more code blocks received from the UE. The UE may retransmit one or more code blocks or portions thereof based on feedback (e.g. decoding results) received from the network regarding first transmissions of the one or more code blocks.

It is known that the DL Physical HARQ Indicator Channel (PHICH) is used by a base station to feedback decoding results to the UE for data received on the PUSCH, when PUSCH is transmitted by the UE. In an aspect, the base station may transmit decoding results of PUCCH using PHICH when there is no transmission of PUSCH in a given frame. Thus, in an aspect, the base station transmits decoding feedback for PUCCH using PHICH only when PHICH is not scheduled to include feedback regarding a transmission received on the PUSCH. In an aspect, the base station may include decoding feedback in a portion of the PHICH resources not scheduled to include feedback for PUSCH.

In certain aspects, one or more additional bits may be added to DCI to indicate decoding results for PUCCH. In an aspect, the DCI carrying the decoding results is the first DCI transmitted after PUCCH is received by the base station.

In certain aspects, a new channel may be introduced for signaling the decoding results of PUCCH. Thus, the decoding results may be transmitted in a new channel configured for indicating the decoding results. In an aspect, orthogonal sequences may be used for multiple users. In an aspect, the resource for the new channel may be predefined and calculated by some known parameters.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Moreover, the term "or" is intended to mean an inclusive "or" rather than an exclusive "or." That is, unless specified otherwise, or clear from the context, the phrase, for example, "X employs A or B" is intended to mean any of the natural inclusive permutations. That is, for example the phrase "X employs A or B" is satisfied by any of the following instances: X employs A; X employs B; or X employs both A and B. As used herein, reference to an element in the singular is not intended to mean "one and only one" unless specifically so stated, but rather "one or more." For example, the articles "a" and "an" as used in this application and the appended claims should generally be construed to mean "one or more" unless specified otherwise or clear from the context to be directed to a singular form. Unless specifically stated otherwise, the term "some" refers to one or more. A phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting and/or means for receiving may comprise one or more of a transmit processor 420, a TX MIMO processor 430, a receive processor 438, or antenna(s) 434 of the base station 110 and/or the transmit processor 464, a TX MIMO processor 466, a receive processor 458, or antenna(s) 452 of the user equipment 120. Additionally, means for obtaining, means for designating, means for aggregating, means for collecting, means for selecting, means for switching, and means for detecting may comprise one or more processors, such as the controller/processor 480, transmit processor 464, receive processor 458, and/or MIMO processor 466 of the user equipment 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, phase change memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A method for wireless communication by a User Equipment (UE), comprising:
assigning bit indices of at least one code block of a control channel to bit channels in a particular order of reliabilities of the bit channels, the at least one code block including Channel State Information (CSI);
polar encoding the at least one code block, including the CSI, based on the bit indices assigned in the particular order of reliabilities of the bit channels;
transmitting the polar encoded at least one code block, including the CSI;
detecting a trigger;
assigning, in response to the trigger, the bit indices of at least a portion of the at least one code block, including the CSI, to the bit channels in a reverse order of reliabilities of the bit channels as compared to the particular order of reliabilities of the bit channels;
polar encoding the portion of the at least one code block, including the CSI, based on the bit indices assigned in the reverse order of reliabilities of the bit channels; and
retransmitting the polar encoded portion of the at least one code block, including the CSI.

2. The method of claim 1, wherein for each code block of the at least one code block:
for the transmitting, the bit indices of the code block are assigned to the bit channels in decreasing order of reliabilities of the bit channels, wherein the CSI is assigned the bit channels starting from a lowest CSI bit index to a highest CSI bit index;
for the retransmitting, the bit indices of the portion are assigned to the bit channels in decreasing order of reliabilities of the bit channels, and wherein the CSI is assigned bit channels starting from the highest CSI bit index to the lowest CSI bit index.

3. The method of claim 1, further comprising:
dividing the CSI into multiple parts;
transmitting each part of the CSI in a different code block, wherein the retransmitted polar encoded portion of the at least one code block includes a portion of at least one of the transmitted parts of the CSI.

4. The method of claim 1, wherein the retransmitted polar encoded portion of the at least one code block does not include Cyclic Redundancy Check (CRC) bits.

5. The method of claim 1, wherein the retransmitted polar encoded portion of the at least one code block includes only a portion of the CSI.

6. The method of claim 1, wherein the retransmitting includes retransmitting the polar encoded portion of the at least one code block at a preconfigured retransmission opportunity, wherein the trigger includes detecting the retransmission opportunity.

7. The method of claim 6, wherein a retransmission opportunity for retransmitting the polar encoded portion of the at least one code block is configured between every two transmissions for the control channel.

8. The method of claim 1, wherein detecting the trigger includes receiving decoding results regarding the transmission of the polar encoded at least one code block, wherein the retransmission of the polar encoded portion of the at least one code block is based on the decoding results.

9. The method of claim 8, further comprising receiving the decoding results on a Physical Hybrid Automatic Repeat Request (HARD) Indicator Channel (PHICH).

10. The method of claim 9, wherein receiving the decoding results comprises receiving the decoding results in the PHICH only when the PHICH is not scheduled to include feedback regarding a transmission on a Physical Uplink Shared Channel (PUSCH).

11. The method of claim 8, further comprising receiving the decoding results as part of Downlink Control Information (DCI).

12. The method of claim 11, wherein the DCI includes an additional bit for indicating the decoding results.

13. The method of claim 8, further comprising receiving the decoding results on a channel configured for indicating the decoding results.

14. The method of claim 1, wherein the control channel includes a Physical Uplink Control Channel (PUCCH).

15. A method for wireless communication by a Base Station (BS), comprising:
receiving a transmission of at least one code block of a control channel, the at least one code block including Channel State Information (CSI), wherein:
bit indices of the at least one code block are assigned to bit channels in a particular order of reliabilities of the bit channels, and
the at least one code block, including the CSI, is polar encoded based on the bit indices assigned in the particular order of reliabilities of the bit channels;
receiving a retransmission of at least a portion of the at least one code block including the CSI, wherein:
bit indices of the portion of the at least one code block, including the CSI, are assigned to the bit channels in a reverse order of reliabilities of the bit channels as compared to the particular order of reliabilities of the bit channels, and the portion of the at least one code block, including the CSI, is polar encoded based on the bit indices assigned in the reverse order of reliabilities of the bit channels; and
decoding the at least one code block based on the transmission and the retransmission.

16. The method of claim 15, wherein for each code block of the at least one code block:
for the transmission, the bit indices of the code block are assigned to the bit channels in decreasing order of reliabilities of the bit channels, wherein the CSI is assigned the bit channels starting from a lowest CSI bit index to a highest CSI bit index;
for the retransmission, the bit indices of the portion are assigned to the bit channels in decreasing order of reliabilities of the bit channels, and wherein the CSI is assigned bit channels starting from the highest CSI bit index to the lowest CSI bit index.

17. The method of claim 15, wherein the decoding includes decoding the at least one code block by combining the transmission and the retransmission.

18. The method of claim 15, wherein the decoding includes:
decoding the retransmission;
designating successfully decoded bits of the retransmission as frozen bits; and
decoding, based on the transmission, remaining bits of the at least one code block not decoded from the retransmission.

19. The method of claim 15, wherein the retransmitted portion of the at least one code block includes only a portion of the CSI.

20. The method of claim 15, wherein receiving the retransmission includes receiving the retransmission of the portion of the at least one code block at a preconfigured retransmission opportunity.

21. The method of claim 20, wherein a retransmission opportunity is configured between every two transmissions of the control channel.

22. The method of claim 15, further comprising transmitting decoding results regarding the transmission of the at least one code block, wherein the retransmission is based on the decoding results.

23. The method of claim 22, further comprising transmitting the decoding results on a Physical Hybrid Automatic Repeat Request (HARD) Indicator Channel (PHICH).

24. The method of claim 23, wherein transmitting the decoding results comprises transmitting the decoding results in the PHICH only when the PHICH is not scheduled to include feedback regarding a transmission received on a Physical Uplink Shared Channel (PUSCH).

25. The method of claim 22, further comprising transmitting the decoding results as part of Downlink Control Information (DCI).

26. The method of claim 25, wherein the DCI includes an additional bit for indicating the decoding results.

27. The method of claim 22, further comprising transmitting the decoding results on a channel configured for indicating the decoding results.

28. The method of claim 15, wherein the control channel includes a Physical Uplink Control Channel (PUCCH).

29. An apparatus for wireless communication by a User Equipment (UE), comprising:
means for assigning bit indices of at least one code block of a control channel to bit channels in a particular order of reliabilities of the bit channels, the at least one code block including Channel State Information (CSI);

means for polar encoding the at least one code block, including the CSI, based on the bit indices assigned in the particular order of reliabilities of the bit channels;
means for transmitting the polar encoded at least one code block, including the CSI;
means for detecting a trigger;
means for assigning, in response to the trigger, the bit indices of at least a portion of the at least one code block, including the CSI, to the bit channels in a reverse order of reliabilities of the bit channels as compared to the particular order of reliabilities of the bit channels;
means for polar encoding the portion of the at least one code block, including the CSI, based on the bit indices assigned in the reverse order of reliabilities of the bit channels; and
means for retransmitting the polar encoded portion of the at least one code block, including the CSI.

30. An apparatus for wireless communication by a Base Station (BS), comprising:
  means for receiving a transmission of at least one code block of a control channel, the at least one code block including Channel State Information (CSI), wherein:
    bit indices of the at least one code block are assigned to bit channels in a particular order of reliabilities of the bit channels, and
    the at least one code block, including the CSI, is polar encoded based on the bit indices assigned in the particular order of reliabilities of the bit channels;
  means for receiving a retransmission of at least a portion of the at least one code block including the CSI, wherein:
    bit indices of the portion of the at least one code block, including the CSI, are assigned to the bit channels in a reverse order of reliabilities of the bit channels as compared to the particular order of reliabilities of the bit channels, and
    the portion of the at least one code block, including the CSI, is polar encoded based on the bit indices assigned in the reverse order of reliabilities of the bit channels; and
  means for decoding the at least one code block based on the transmission and the retransmission.

* * * * *